United States Patent [19]

Hirota et al.

[11] Patent Number: 4,739,142
[45] Date of Patent: Apr. 19, 1988

[54] METHOD OF PRODUCING A WIRE BONDING BALL

[75] Inventors: Jitsuho Hirota, Amagasaki; Kazumichi Machida, Takarazuka; Masaaki Shimotomai, Kawanishi, all of Japan

[73] Assignee: Mitsubishi Denki Kabushiki Kaisha, Tokyo, Japan

[21] Appl. No.: 939,962

[22] Filed: Dec. 10, 1986

[30] Foreign Application Priority Data

Dec. 10, 1985 [JP] Japan ............... 60-276841

[51] Int. Cl.⁴ .............................................. B23K 9/00
[52] U.S. Cl. ................................................ 219/56.22
[58] Field of Search ............... 219/56.21, 56.22, 130.51

[56] References Cited

U.S. PATENT DOCUMENTS 3,598,954  8/1971  Iceland ..................... 219/130.51
4,388,512  6/1983  Salzer et al. ................ 219/56.22

FOREIGN PATENT DOCUMENTS 53-123663  10/1978  Japan .

OTHER PUBLICATIONS

J. Kurtz et al., "Copper Wire Ball Bonding", 5/1984.
"Ultrasonic Wire Welding", by K. I. Johnson et al., Solid State Technology, vol. 20, 1977, pp. 91–95.
"Aluminum Wire for Thermasonic Ball Bonding in Semiconductor Devices", by Bruce L. Gehman et al., Solid State Technology, vol. 26, 1983, pp. 151–158.

Primary Examiner—Clifford C. Shaw
Attorney, Agent, or Firm—Birch, Stewart, Kolasch & Birch

[57] ABSTRACT

A method of producing a wire bonding ball for ball bonding a metal wire to an electrode of a semiconductor chip involves producing a ball by melting the top end of the metal wire by a discharge which is conducted by applying a high voltage between said metal wire and a discharge electrode in an inactive gas ambient. The metal wire is at a positive voltage said the discharge electrode is at a negative voltage, respectively. Next, a latter period discharge is conducted by inverting the voltage polarities of the discharge electrode elements. The metal wire used is a material capable of being oxidated.

3 Claims, 3 Drawing Sheets (PRIOR ART)

METHOD OF PRODUCING A WIRE BONDING BALL

FIELD OF THE INVENTION

The present invention relates to a method of producing a ball for ball bonding a metal wire in a process of producing ICs or transistors.

BACKGROUND ART

Conventionally gold wires are used as bonding metal wires, but in this case the cost becomes higher, and the long period reliability of the junction portion bonded to the aluminum electrode on a silicon chip is disadvantageously low, and accordingly it is thought that wires comprising such as copper, aluminum, palladium, or metal alloys including any of them can be used instead of gold.

Furthermore, it is required to make the top end of the wire with a spherical shape so as not to have any directionality in a wire bonding process. In the conventional gold wire the wire, is melted to have a spherical shape by conducting a discharge between the top end of the wire and a movable electrode (discharge electrode) by a high voltage application therebetween to give heat to the top end of the wire.

In this case, the polarity of the applied voltage is made such that the electrode is the plus and the wire is the minus from the consideration on the easiness of dielectric breakdown in all the conventional methods.

FIG. 3 shows a situation where a ball production is conducted against a copper wire having a naturally oxidated film of about 10 Å at the surface of the copper wire by a method similar to that which is executed to the conventional gold wire. In FIG. 3, the reference numeral 1 designates a copper wire, the reference numeral 2 designates a discharge electrode, the reference numeral 3 designates an arc, the reference numeral 4 designates a power supply, the reference numeral 5 designates a capillary chip as a bonding tool, and the reference numeral 6 designates a portion at which an electrode is produced, and to which heat is given. The reference numeral 7 designates an inactive gas ambient such as argon, and the reference numeral 8 designates a portion produced with receiving the melted hysteresis.

In this method there is a physical scientific nature that the hot electron emission is willing to broaden the electrode region by searching a more stable point where the work function is small (that is, quite a thin metal oxide film) at the side of the minus electrode at the discharging. Accordingly, in a case where the wire 1 is at a minus voltage an arc 3 is produced up to a portion above the wire 1 as shown in FIG. 3(a), and heat is given from the surface portion of the wire 1. As a result, it is likely to generate a faulty ball 8 with remaining a core, that is, an unmelted portion 1a of the wire 1 at the top end thereof. This faulty ball 8 remains to include an unmelted portion 1a inside thereof although it has a spherical configuration, and the ball including the unmelted portion is difficult to be transformed when it is bonded to the aluminum electrode on a silicon chip. Such a property of the prior art ball may cause damages to arise to the silicon chip.

However, in a case of using a gold wire in a conventional method there arises no such problem because the gold wire produces no oxides at the surface thereof. Then, the wire is placed at the minus side as described above from the consideration on the easiness of occurring the discharge.

SUMMARY OF THE INVENTION

An object of the present invention is to provide an improved method of producing a wire bonding ball capable of producing a ball which causes no damage to a silicon chip at the wire bonding even when a copper wire is used.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a method of producing a wire bonding ball for ball bonding a metal wire to an electrode of a semiconductor chip, which comprises: producing a ball by melting the top end of said metal wire by a discharge which is conducted by applying a high voltage between said metal wire and a discharge electrode in an inactive gas ambient with placing said metal wire at a plus voltage and said discharge electrode at a minus voltage, respectively; conducting a latter period discharge with inverting the voltage polarities of said discharge electrode elements; and said metal wire comprising material capable of being oxidated.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
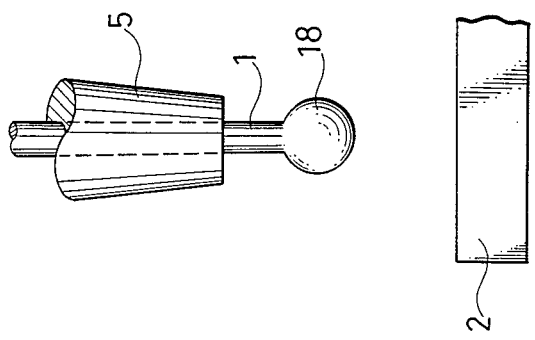
FIGS. 1(a) and 1(b) are diagrams showing a state where an arc discharge is conducted and a state where a ball is produced, respectively, in a process of producing a wire bonding ball as an embodiment of the present invention.
Figure 1:
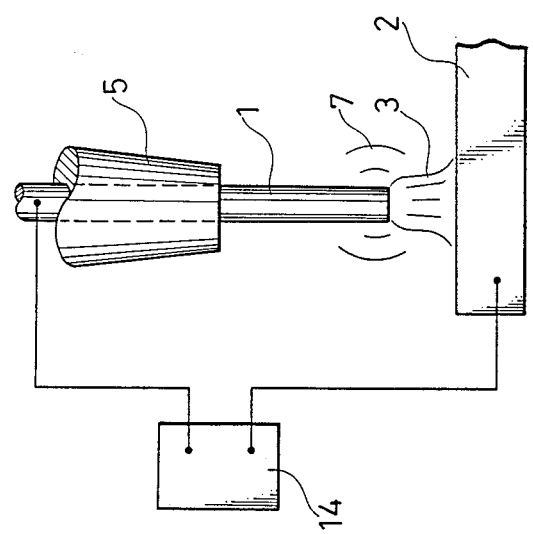
Figure 2:
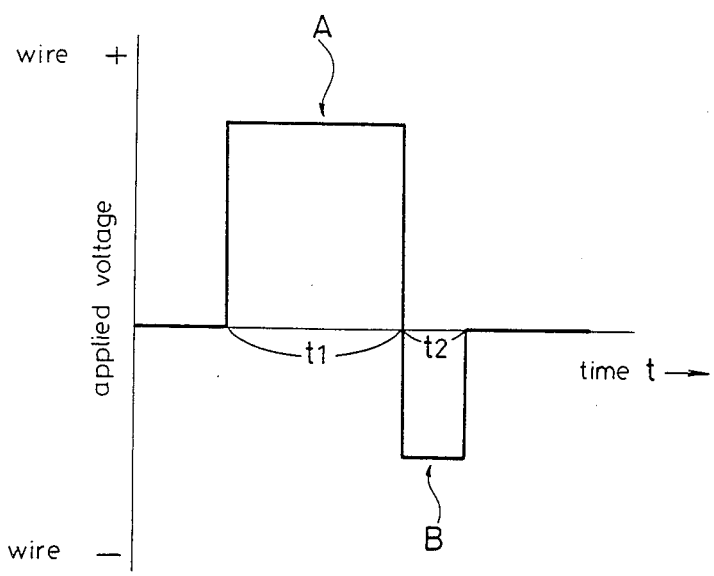
FIG. 2 is a diagram showing a timing chart of voltage application in the above described method.

In order to explain the present invention in detail, reference will be particularly made to FIGS. 1 and 2.

Figure 3A:
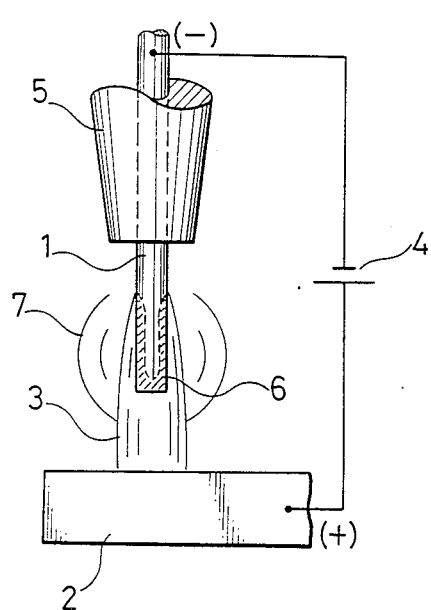
FIGS. 3(a) and 3(b) are diagrams showing a state where an arc discharge is conducted and a state where a ball is produced, respectively, in a prior art method.
Figure 3B:
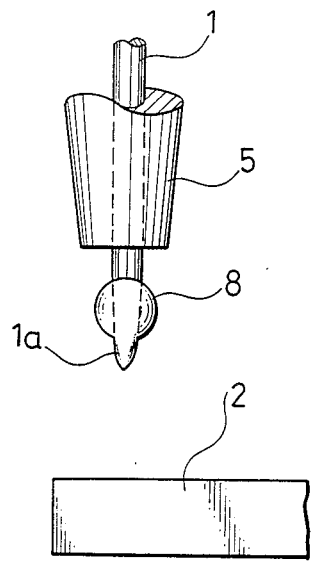

In FIGS. 1 and 2, the same reference numerals designate the same elements as those shown in FIG. 3. The reference numeral 14 designates an AC power supply, and the reference numeral 18 designates a ball which is produced with receiving the melted hysteresis.

The method of the present embodiment is conducted as follows.

At first a high voltage is applied between the metal wire 1 and the discharge electrode 2 with the metal wire 1 at a plus voltage and the discharge electrode 2 at a minus voltage (refer to FIG. 2(a)) in an inactive gas ambient. Then, a discharge arises between the top end of the copper wire 1 and the discharge electrode 2, thereby to produce an arc 3, and heat is given to the top end of the copper wire 1, thereby to melt the top end. The portion of the wire 1 to be melted is restricted to the top end of the wire 1 because the heat is injected concentratedly only to the top end by the characteristics of the discharge, and the volume of the melted portion is increased with the portion keeping a complete spherical shape.

When time t1 is passed after the start of the voltage application, the copper wire 1 is placed at a minus voltage and the discharging electrode 2 is placed at a plus voltage (refer to FIG. 2). Then, the surface of the ball 18 is cleaned by the cleaning function which is possessed by the arc 3 at the minus electrode side, and accordingly, when time t2 is passed by a ball 18 which does not have an unmelted portion and has a clean surface is produced. Thereafter, the ball 18 of the copper wire 1 is ball bonded to the aluminum electrode of the semiconductor chip by a similar method as that of the conventional method. Besides, the other end of the copper wire is stitch bonded to a lead.

In the present embodiment with such a construction, ball production is conducted with placing a copper wire at a plus voltage and a discharge electrode at a minus voltage, thereby enabling an injection of heat concentratedly only to the top end of the wire, and of obtaining a ball which has a spherical configuration and a completely melted whole body easily and stably. As a result, the ease of transformation of the ball at the bonding to the aluminum electrode on a silicon chip is improved and the possibility of damage to the silicon chip is avoided.

Furthermore, even if a ball having a completely melted whole body is obtained, the hardness of the ball is inadvantageously increased by the mixture of oxygen when the ball is oxidated at the production of the ball. If the surface of the ball is oxidated the produced ball does not have a real spherical shape, resulting in a deterioration in the bonding. On the contrary, in the present invention, the ball production is conducted in an inactive gas ambient, whereby the oxygen is prevented from being mixed into the ball. Furthermore, the polarity of the voltage of the copper wire is changed to the minus at the latter period of the discharge, whereby the oxidation of the ball surface does not arise due to the surface cleaning function of the arc. As a result there arises no increase in the hardness of the ball, and the ball is assured of having a real spherical shape, thereby assuring a stable bonding.

Furthermore, even when a copper wire is used a ball which has a completely melted whole body, a clean surface and a real spherical shape is obtained, and good ball bonding characteristics are assured also in this case. As a result, a low cost copper wire can be used in replace of a gold wire, thereby resulting in a reduction in the cost to a great extent, and enhancing the long period reliability in the bonding to the aluminum electrode on a chip.

In the illustrated embodiment, a copper wire is used as a metal wire, but aluminum, palladium, silver, or a low element added metal alloy comprising any of them or a low element added copper metal alloy can be used as a wire.

As is evident from the foregoing description, according to the present invention, a high voltage is applied between a metal wire and a discharge electrode in an inactive gas ambient with placing the metal wire at a plus voltage and the discharge electrode at a minus voltage to cause a discharge therebetween, the top end portion of the metal wire is melted by the discharge to produce a ball, and the voltage of the metal wire and the discharge electrode are inverted to the minus side and the plus side, respectively, in a latter period of the discharge, whereby a metal wire can be bonded to an electrode on a chip without any damage to a silicon chip. As a result the use of a low cost metal wire other than a gold wire is effected.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for producing a wire bonding ball for use in ball bonding a metal wire to an electrode of a semiconductor chip comprising the steps of:
   providing a metal wire and a discharge electrode, said metal wire being located proximate to said electrode, said metal wire and said discharge electrode being located in an inactive ambient gas and said metal wire being comprised of material which is capable of being oxidated but which oxidation is avoided as the metal wire is located in said inactive ambient gas;
   applying a high voltage between said metal wire and said discharge electrode, said metal wire is placed at a positive voltage while said discharge electrode is placed at a negative voltage;
   melting an end portion of said wire due to said applying a high voltage, said melting forming a generally, spherical shape at said end portion;
   switching the voltage only once such that the metal wire is placed at a negative voltage and the discharge electrode is placed at a positive voltage; and
   cleaning said generally, spherical shape due to said switching the voltage.

2. A method of producing a wire bonding ball as defined in claim 1, further including the step of using a copper wire for said metal wire.

3. The method for producing as recited in claim 1 wherein said switching includes the steps of;
   using less current for said voltage after said switching; and
   applying the lower voltage for a period of time less than said applying of said high voltage.

* * * * *